United States Patent
Takaoka et al.

(10) Patent No.: US 7,939,186 B2
(45) Date of Patent: *May 10, 2011

(54) CUTTING TOOL MADE OF SURFACE-COATED CUBIC BORON NITRIDE-BASED ULTRA-HIGH-PRESSURE SINTERED MATERIAL

(75) Inventors: Hidemitsu Takaoka, Yuki-gun (JP); Itsurou Tajima, Yuki-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 826 days.

This patent is subject to a terminal disclaimer.

(21) Appl. No.: 11/753,053

(22) Filed: May 24, 2007

(65) Prior Publication Data

US 2007/0275268 A1    Nov. 29, 2007

(30) Foreign Application Priority Data

May 26, 2006    (JP) .................................. 2006-147300

(51) Int. Cl.
B23B 27/14    (2006.01)
(52) U.S. Cl. ............ 428/697; 51/307; 51/309; 428/216; 428/336; 428/698; 428/699; 428/704
(58) Field of Classification Search .................... 51/307, 51/309; 428/216, 336, 697, 698, 699, 701, 428/702, 704
See application file for complete search history.

(56) References Cited

U.S. PATENT DOCUMENTS

| | | | |
|---|---|---|---|
| 5,503,912 A | 4/1996 | Setoyama et al. | |
| 5,580,653 A | 12/1996 | Tanaka et al. | |
| 5,709,907 A | 1/1998 | Battaglia et al. | |
| 5,712,030 A | 1/1998 | Goto et al. | |
| 5,722,803 A | 3/1998 | Battaglia et al. | |

(Continued)

FOREIGN PATENT DOCUMENTS

DE    19546357    6/1996

(Continued)

OTHER PUBLICATIONS

Anderson et al., Deposition, microstructure and mechanical and tribological properties of magnetron sputtered TiN/TiAlN multilayers, Surface and Coating Technology, 2000, pp. 219-226, vol. 123.

(Continued)

*Primary Examiner* — Archene Turner
(74) *Attorney, Agent, or Firm* — Leason Ellis LLP.

(57) ABSTRACT

A cutting tool made of a surface-coated cubic boron nitride-based ultra-high-pressure sintered material, comprising a cutting insert main body formed by ultra-high-pressure sintering of a compact composed of titanium nitride, aluminum and/or aluminum oxide, and boron nitride, and a hard coating layer vapor deposited on the main body. The main body has a texture containing cubic boron nitride, titanium nitride and reaction product. The hard coating layer has a lower layer of nitride having a composition of $[Ti_{1-X-Y}Al_XSi_Y]N$, where X is in a range from 0.40 to 0.60 and Y is in a range from 0.02 to 0.10 in an atomic ratio, and the upper layer comprises a thin layer A having the composition of $[Ti_{1-X-Y}Al_XSi_Y]N$, where X is in a range from 0.40 to 0.60 in an atomic ratio and Y is in a range from 0.02 to 0.10, and a thin layer B consisting of a Ti nitride (TiN). The upper layer consists of the thin layer A and a thin layer B layered alternately.

6 Claims, 2 Drawing Sheets

U.S. PATENT DOCUMENTS

| | | | |
|---|---|---|---|
| 5,853,873 A | 12/1998 | Kukino et al. | |
| 5,882,777 A * | 3/1999 | Kukino et al. | 51/307 |
| 5,882,778 A * | 3/1999 | Sugizaki et al. | 428/697 |
| 6,077,596 A | 6/2000 | Hashimoto et al. | |
| 6,103,357 A | 8/2000 | Selinder et al. | |
| 6,309,738 B1 | 10/2001 | Sakurai | |
| 6,395,379 B1 | 5/2002 | Braendle | |
| 6,599,062 B1 | 7/2003 | Oles et al. | |
| 6,623,850 B2 | 9/2003 | Kukino et al. | |
| 6,737,178 B2 | 5/2004 | Ota et al. | |
| 7,060,345 B2 * | 6/2006 | Fukui et al. | 428/336 |
| 7,094,479 B2 * | 8/2006 | Sato et al. | 428/699 |
| 7,258,912 B2 * | 8/2007 | Yamamoto et al. | 428/216 |
| 7,510,761 B2 * | 3/2009 | Kondo et al. | 428/216 |
| 2001/0003569 A1 | 6/2001 | Ota et al. | |
| 2003/0096142 A1 | 5/2003 | Whiteis | |
| 2005/0170162 A1 | 8/2005 | Yamamoto et al. | |
| 2007/0148496 A1 * | 6/2007 | Takaoka et al. | 428/698 |

FOREIGN PATENT DOCUMENTS

| | | |
|---|---|---|
| EP | 0695731 | 2/1996 |
| EP | 0709353 | 5/1996 |
| EP | 1312593 | 5/2003 |
| EP | 1382709 | 1/2004 |
| EP | 1470879 | 10/2004 |
| EP | 1690959 | 8/2006 |
| EP | 1801260 | 6/2007 |
| JP | 59-153851 | 9/1984 |
| JP | 07-205362 | 8/1995 |
| JP | 7-300649 A | 11/1995 |
| JP | 07-310174 A | 11/1995 |
| JP | 8-119774 A | 5/1996 |
| JP | 08-323506 | 12/1996 |
| JP | 2001-234328 | 8/2001 |
| JP | 2003-245806 | 9/2003 |
| JP | 2004-345006 * | 12/2004 |

OTHER PUBLICATIONS

Hsieh et al., Deposition and characterization of TiAlN and multi-layered TiN/TiAlN coaings using unbalanced magnetron sputtering, Surface and Coating Technology, 1998, pp, 132-137, vol. 108-109.

US Office Action mailed Jul. 20, 2010 for the related U.S. Appl. No. 11/613,323.

The U.S. Office Action mailed Jan. 3, 2011 for the related U.S. Appl. No. 11/613,323.

* cited by examiner

CUTTING TOOL MADE OF SURFACE-COATED CUBIC BORON NITRIDE-BASED ULTRA-HIGH-PRESSURE SINTERED MATERIAL

BACKGROUND OF THE INVENTION

1. Field of the Invention

The present invention relates to a cutting tool made of a surface-coated cubic boron nitride-based ultra-high-pressure sintered material (hereinafter referred to as a surface-coated cBN-based sintered tool) comprising a cutting tool body made of a cubic boron nitride-based ultra-high-pressure sintered material and a hard coating layer provided on the surface of the cutting tool body, which comprises a hard coating layer having excellent high-temperature hardness, high-temperature strength, heat resistance and edge notching resistance, and also can exhibit excellent edge notching resistance and maintain excellent performance (e.g. providing an excellent surface finish of workpieces) over an extended period of time even in a high speed cutting operation of a hard steel, such as alloy steel or hardened bearing steel.

Priority is claimed on Japanese Patent Application No. 2006-147300 filed May 26, 2006, the contents of which are incorporated herein by reference.

2. Background Art

A surface-coated cBN-based sintered tool in general includes an insert that is removably attached at the tip of a cutting tool for turning of workpieces made of various types of steel or cast iron, and an insert type end mill that is removably attached with an indexable insert and is used in chamfering, grooving and shouldering of workpieces in a manner similar to that of a solid end mill.

One known constitution of surface-coated cBN-based sintered tools includes a tool body made of various cubic boron nitride-based ultra-high-pressure sintered materials (hereinafter referred to as a cBN-based sintered material) and a surface-coating layer such as a titanium nitride (TiN) layer or a titanium aluminum silicon nitride ([Ti, Al, Si]N) layer formed by vapor deposition on the surface of the tool body. It is also known that these surface-coated cBN-based sintered tools are used for cutting workpieces made of various types of steel or cast irons (Japanese Patent No. 3460288).

It is also known that the above-described surface-coated cBN-based sintered tool can be manufactured by coating the surface of the tool body S with a layer of a suitable composition, for example, a TiN layer or [Ti, Al,Si]N layer using an arc ion plating apparatus, as a variation of a physical vapor deposition apparatus schematically exemplified by FIGS. 1A and 1B. For example, the surface coating layer may be formed by setting the tool body in the arc ion plating apparatus; generating arc discharge by supplying a current of 90 A between anodes 61, 62 and cathodes (evaporation source) 31, 32 consisting of metallic Ti or a Ti—Al—Si alloy of a predetermined composition, where the ambient temperature is maintained at, for example, 500° C. by a heater, while nitrogen gas is introduced as a reaction gas into the apparatus so as to achieve a reaction atmosphere with a pressure of 2 Pa, and a bias voltage of, for example, −100 V is applied to the tool body (Japanese Patent, No. 2793773).

There have recently been remarkable developments in both the design and installation Factory Automatization (FA) of cutting apparatuses. On the other hand, there are still strong demands for labor saving, energy saving and cost reduction in cutting operations. Therefore, in addition to a cutting operation under ordinary conditions, there is an increasing demand for a cutting operation under high-speed cutting conditions.

The conventional surface-coated cBN-based sintered tool performs satisfactorily in machining of steel and cast iron under ordinary cutting conditions. However, when it is used in a high-speed continuous cutting operation or a high-speed interrupted cutting operation of a hard steel (steel having high hardness), such as alloy steel or hardened (quenched) bearing steel which has a Rockwell hardness (C scale) as high as 50 or more, damage (hereinafter referred to as edge notching) occurs at the boundary portion of the cutting edge by high degree of heat generated at a cutting edge or a drastically large mechanical load is imposed intermittently and impulsively at the cutting edge. As a result, it becomes difficult to maintain the surface finish of workpieces when the tool is used over an extended period of time. Thus the cutting tool reaches the end of its tool life in a relatively short period of time.

SUMMARY OF THE INVENTION

Under the circumstances described-above, the present inventors conducted research aiming at the development of a surface-coated cBN-based sintered tool having a hard coating layer that exhibits excellent edge notching resistance in a high-speed continuous cutting operation or a high-speed interrupted cutting operation (hereinafter referred merely to as "high-speed cutting operation") of a hard steel, such as alloy steel or hardened bearing steel, and ensures an excellent surface finish of workpieces even when the tool is used for a long period of operation time, and arrived at the following findings (a) through (c).

(a) A Ti—Al—Si nitride [$Ti_{1-X-Y}Al_XSi_Y$]N layer that constitutes a hard coating layer has excellent heat resistance, high-temperature hardness and high-temperature strength, and therefore is provided with the properties required under common cutting conditions, where the proportion X of Al content (atomic ratio) is in a range from 0.40 to 0.60 and the proportion of Y of Si content (atomic ratio) is in a range from 0.02 to 0.10. However, in a high-speed interrupted cutting operation, which generates high degree of heat at the cutting edge or imposes a drastically large mechanical load intermittently and impulsively on the cutting edge, because of insufficient high-temperature strength of the hard coating layer consisting of the Ti—Al—Si nitride [$Ti_{1-X-Y}Al_XSi_Y$]N, edge notching occurs at the boundary portion of the cutting edge. As a result, since chipping of the cutting edge easily occurs, it is difficult to maintain the surface finish of workpieces, and the cutting tool reaches the end of its tool life in a relatively short period of time.

(b) Although the Ti nitride (TiN) layer has excellent high-temperature strength and shock-resistant strength, it is not provided with sufficient heat resistance and high-temperature hardness. Therefore, in a high-speed interrupted cutting operation of a hard steel, which generates extremely high degree of heat and imposes a drastically large mechanical load intermittently and impulsively on the cutting edge, a hard coating layer consisting only of the Ti nitride (TiN) layer cannot have sufficient wear resistance.

(c) When the [$Ti_{1-X-Y}Al_XSi_Y$]N layer of the above described (a) having the proportion X of Al content in a range from 40 to 60 atomic %, having the proportion Y of Si content in a range from 2 to 10 atomic % and having heat resistance, high-temperature hardness and predetermined high-temperature strength is defined as thin layer A, a Ti nitride (TiN) layer which is inferior in heat resistance and high-temperature hardness as compared with the thin layer A but is excellent in high-temperature strength and shock-resistant strength is defined as thin layer B, and the thin layers A and B are layered alternately so as to constitute an upper layer of a hard coating layer such that each of thin layers A and B has an average layer thickness of 0.05 to 0.3 µm, the hard coating layer having the alternately layered structure has excellent heat resistance and high-temperature hardness of the thin layer A and also has more excellent high-temperature strength and shock-resistant strength of the thin layer B, and thus the occurrence of chipping and occurrence of edge notching can be prevented. As a result, an excellent surface finish of workpieces can be maintained even when the tool is used for a long period of time. That is, even when the cutting operation of a workpiece is performed after a repeated use of the tool and the operation time of the tool exceeds the tool life of conventional surface-coated cBN-based sintered tool, a machined surface of the workpiece shows an excellent surface finish.

The findings (a) through (c) were obtained through the inventors' research.

The present invention has been made on the basis of the findings described above, and provides a cutting tool made of surface-coated cubic boron nitride-based ultra-high-pressure sintered material (material which has been sintered under an ultra-high-pressure condition), comprising a main body of a cutting insert and a hard coating layer vapor-deposited on the surface of the main body.

The main body of cutting insert consists of an ultra-high-pressure sintered material formed by ultra-high-pressure sintering of a compact having a composition of, in mass %, 13 to 30% of titanium nitride, 6.5 to 18% of aluminum and/or aluminum oxide and the balance of boron nitride. Under an observation using a scanning electron microscope, the main body shows a texture such that a reaction product formed by the ultra-high-pressure sintering process is present at the interface between a cubic boron nitride phase constituting a dispersed phase and a titanium nitride phase constituting a continuous phase. The hard coating layer deposited on the main body has a constitution of the following (a) to (c).

(a) The hard coating layer includes a lower layer having an average layer thickness in a range from 1.5 to 3 µm and an upper layer having an average layer thickness in a range from 0.3 to 3 µm.

(b) The lower layer of the hard coating layer includes a vapor-deposited nitride of Ti, Al and Si having a composition (composition represented by a chemical formula) of $[Ti_{1-X-Y}Al_XSi_Y]N$, where X is in a range from 0.40 to 0.60 in atomic ratio and Y is in a range from 0.02 to 0.10 in atomic ratio.

(c) The upper layer of the hard coating layer is vapor-deposited on the lower layer and has a structure including at least one thin layer A and at least one thin layer B layered alternately, where the thin layer A is a nitride layer of Ti, Al and Si having the composition of $[Ti_{1-X-Y}Al_XSi_Y]N$, where X is in a range from 0.40 to 0.60 in atomic ratio, Y is in a range from 0.02 to 0.10 in atomic ratio and the thin layer B is a Ti nitride (TiN) layer. In that layered structure, each of the thin layers A and B has an average layer thickness of 0.05 to 0.3 µm.

Even in a high speed cutting operation of a hard steel, the cutting tool made of a surface-coated cubic boron nitride-based ultra-high-pressure sintered material (hereafter referred to as a coated cBN-based sintered tool) of the above-described constitution can ensure an excellent surface finish of a workpiece over an extended period of time during a high-speed cutting operation of hard steel.

Next, the reasons for setting the numerical specifications of the composition of the cBN-based sintered material of the cutting insert body constituting the surface-coated cBN-based sintered tool of the present invention, and the composition and thickness of the hard coating layer are explained in the following.

(A) Composition of cBN-Based Sintered Material of Cutting Insert Body

TiN

A TiN component in a sintered material has an effect of improving sinterability and forming a continuous phase in a sintered body, thereby improving the strength. When the proportion of the TiN component content is less than 13% by mass, desired strength cannot be ensured. On the other hand, when the proportion of the TiN component content is more than 30% by mass, the content of cBN decreases relatively and face wear is more likely to occur. Accordingly, the proportion of the TiN component content was set in a range from 13 to 30% by mass.

Aluminum and/or Aluminum Oxide

These components are preferentially aggregated on the surface of a cBN powder during sintering and are reacted to form a reaction product, and thus these components are present between a TiN phase constituting a continuous phase and a cBN phase constituting a hard dispersed phase in a cBN-based material after sintering. Since the reaction product has properties of firmly adhering close to both of TiN phase constituting the continuous phase and the cBN phase constituting the hard dispersed phase, adhesion of the cBN phase to the TiN phase as the continuous binder phase is remarkably improved, thus resulting in improved chipping resistance of the cutting edge. When the proportions of aluminum and/or aluminum oxide contents deviate from the range of 6.5 to 18% by mass, it is impossible for an intermediate adhesive layer and firm adhesion between the hard dispersed phase and the continuous phase to be realized. Accordingly, the proportions of the aluminum and/or aluminum oxide contents were set in a range from 6.5 to 18% by mass.

Cubic Boron Nitride (cBN)

Cubic boron nitride (cBN) in a tool body made of an ultra-high-pressure sintered material is very hard and forms a dispersed phase in the sintered material, and wear resistance is improved by the dispersed phase. When the proportion of the cubic boron nitride content is too small, desired excellent wear resistance cannot be ensured. On the other hand, when the proportion of the cubic boron nitride content is too large, sinterability of the cubic boron nitride (cBN)-based material itself deteriorates, thus making it easier for chipping of the cutting edge to occur. The proportion of the cubic boron nitride (cBN) content is the balance of TiN, aluminum and aluminum oxide as constituent components of the sintered material, namely, 52 to 80.5% by mass.

(B) Lower Layer of Hard Coating Layer

Since a Ti component in a Ti—Al—Si nitride ($[Ti_{1-X-Y}Al_XSi_Y]N$) layer constituting a lower layer of a hard coating layer contributes to retention of the high-temperature strength, an Al component contributes to improvement of high-temperature hardness and heat resistance, and an Si component contributes to still further improvement of heat resistance, the Ti—Al—Si nitride ($[Ti_{1-X-Y}Al_XSi_Y]N$) layer constituting the lower layer of the hard coating layer is a layer having excellent high-temperature strength, high-temperature hardness and heat resistance and basically plays a role of ensuring wear resistance of the cutting edge in a high-speed cutting operation of a hard steel. When the proportion X of the Al content is more than 60 atomic %, high-temperature hardness and heat resistance of the lower layer are improved. However, the high-temperature strength decreases by a relative decrease in the proportion of the Ti content, thus making it easier for chipping to occur. On the other hand, when the proportion X of the Al content is less than 40 atomic %, high-temperature hardness and heat resistance deteriorate, thus resulting in poor wear resistance. When the proportion Y of the Si content is more than 10 atomic %, high-temperature strength decreases drastically. On the other hand, when the proportion Y of the Si content is less than 2 atomic %, excellent effect of improvement of heat resistance cannot be expected. Accordingly, the proportion X of the Al content was set in a range from 0.40 to 0.60 in atomic ratio and the proportion Y of the Si content was set in a range from 0.02 to 0.10 in atomic ratio.

When an average layer thickness of the lower layer is less than 1.5 μm, it is impossible to impart heat resistance, high-temperature hardness and high-temperature strength of the lower layer to the hard coating layer over an extended period of time, thus resulting in a short tool life. On the other hand, when the average layer thickness is more than 3 μm, chipping is more likely to occur. Accordingly, the average layer thickness of the lower layer was set in a range from 1.5 to 3 μm.

In order to ensure sufficient adhesion between a cutting tool body made of an ultra-high-pressure sintered material and a lower layer, a thin layer made of titanium nitride (TiN) can be interposed between the tool body and the lower layer. When the layer thickness of the thin layer made of TiN is less than 0.01 μm, a lesser effect of improving adhesion is exerted. On the other hand, when the layer thickness is more than 0.5 μm, further improvement in adhesion can not be expected. Accordingly, the layer thickness of the TiN layer to be interposed between the tool body and the lower layer is preferably set to 0.01 μm or more and 0.5 μm or less.

(C) Upper Layer of Hard Coating Layer

1) Thin Layer A of Upper Layer

A Ti—Al—Si nitride ($[Ti_{1-X-Y}Al_X Si_Y]N$) layer (where X is in a range from 0.40 to 0.60 in atomic ratio and Y is in a range from 0.02 to 0.10 in atomic ratio) constituting a thin layer A of an upper layer is substantially similar to the lower layer, and has a predetermined heat resistance, high-temperature hardness and high-temperature strength and also has the effect of ensuring wear resistance at the cutting edge in a high-speed cutting operation of a hard steel 2) Thin Layer B of Upper Layer A main object of a thin layer B made of Ti nitride (TiN) is to make up for insufficient characteristics (high-temperature strength, shock-resistant strength) of the thin layer A in the upper layer having an alternately layered structure having the thin layer A and the thin layer B.

As described hereinabove, the thin layer A of the upper layer is a layer having excellent heat resistance, high-temperature hardness and high-temperature strength, but does not exhibit sufficient high-temperature strength and shock-resistant strength in a high-speed cutting operation of a hard steel, which imposes a large mechanical load and generates high degree of heat. Consequently, edge notching occurs at the boundary portion of a lip of the cutting edge causing deterioration of the surface finish, and chipping occurs easily.

By alternately layering the thin layer B made of Ti nitride (TiN) having excellent high-temperature strength and shock-resistant strength, and the thin layer A to form an alternately layered structure, insufficient high-temperature strength and shock-resistant strength of the adjacent thin layer A are complemented, and an upper layer having further excellent high-temperature strength and shock-resistant strength of the thin layer B is formed without impairing excellent heat resistance, high-temperature hardness and high-temperature strength of the thin layer A.

The Ti nitride (TiN) layer has excellent high-temperature strength and shock-resistant strength and has the effect of preventing the occurrence of edge notching at the boundary portion of a lip of a cutting edge in a high-speed cutting operation of a hard steel, which generates high degree of heat.

3) Average Layer Thickness of Single Thin Layer A and Single Thin Layer B of Upper Layer, and Average Layer Thickness of Upper Layer When the average layer thickness of each single layer of the thin layers A and the thin layers B of the upper layer is less than 0.05 μm, excellent characteristics of each thin layer can not be exhibited and thus it becomes impossible to impart excellent high-temperature hardness, high-temperature strength and heat resistance as well as further excellent high-temperature strength and shock-resistant strength to the upper layer. On the other hand, when the average layer thickness of each single layer of the thin layers A is more than 0.3 μm or the average layer thickness of each single layer of the thin layers B is more than 0.3 μm, defective properties of each thin layer, namely, insufficient high-temperature strength and shock-resistant strength of the thin layer A or insufficient heat resistance and high-temperature hardness of the thin layer B, appear locally in the upper layer, thus making it easier for edge notching of a lip of a cutting edge to occur, deteriorating the surface finish, or accelerating the progress of wear. Accordingly, the average layer thickness of each single thin layer of thin layers A and thin layers B was set in the range from 0.05 to 0.3 μm.

The thin layer B was provided so as to impart further excellent high-temperature strength and shock-resistant strength to the upper layer. When the average layer thickness of each single thin layer of the thin layer A and the thin layer B is in the above-described range, the upper layer having an alternately layered structure of the thin layer A and the thin layer B serves as one layer having excellent heat resistance and high-temperature hardness as well as still further excellent high-temperature strength and shock-resistant strength. When the average layer thickness of each single thin layer of the thin layer A and the thin layer B deviates from the above-described range, insufficient high-temperature strength and shock-resistant strength of the thin layer A or insufficient heat resistance and high-temperature hardness of the thin layer B appear locally in the upper layer, and thus the upper layer cannot exhibit good characteristics as one layer. Accordingly, the average layer thickness of each single thin layer of the thin layer A and the thin layer B was set in the range from 0.05 to 0.3 μm.

By forming an upper layer having an alternately layered structure consisting of at least one thin layer A and at least one thin layer B layered alternately, where the average layer thickness of each single thin layer of the thin layer A and the thin layer B was set in the range from 0.05 to 0.3 μm, on the surface of the lower layer, a hard coating layer having excellent heat resistance and high-temperature hardness as well as further excellent high-temperature strength and shock-resistant strength is obtained, thus making it possible to prevent the occurrence of edge notching at the boundary portion of a lip of a cutting edge and to maintain performance (e.g., providing an excellent surface finish of workpieces) in a high-speed continuous cutting operation or a high-speed interrupted cutting operation of a hard steel.

Preferably, the average layer thickness of each single thin layer of thin layers A may be set in the range from 0.05 to 0.2 μm.

When the total average layer thickness (namely, the total layer thickness as a sum of respective average layer thicknesses of the thin layer A and the thin layer B that constitute an alternately layered structure) of the upper layer is less than 0.3 μm, sufficient heat resistance, high-temperature hardness, high-temperature strength and shock-resistant strength required in a high-speed cutting operation of a hard steel cannot be imparted to the upper layer, thus resulting in a shorter tool life. On the other hand, when the layer thickness is more than 3 μm, chipping is more likely to occur. Accordingly, the average layer thickness of the upper layer was set in a range from 0.3 to 3 μm.

Preferably, the average layer thickness of each single layer of the thin layer A and the thin layer B is controlled to be not larger than a half of the average layer thickness of the upper layer.

In the surface-coated cBN-based sintered tool of the present invention, there is an occasional case in which an interference color developed varies slightly depending on the layer thickness of the coating layer on the outermost surface, thus resulting in an uneven appearance of the tool. In such a case, an uneven appearance of the tool can be prevented by forming a thick Ti—Al—Si nitride (TiAlSiN) layer using a vapor deposition method. In that case, when the average layer thickness of the TiAlSiN layer is less than 0.2 μm, an uneven appearance cannot be prevented. When the average layer thickness is not more than 2 μm, an uneven appearance can be sufficiently prevented. Accordingly, the average layer thickness of the Ti—Al—Si nitride (TiAlSiN) layer may be set in a range from 0.2 to 2 μm.

The surface roughness in Ra of the tool body of the surface-coated cBN-based sintered tool of the present invention is preferably 0.05 μm or more and 1.0 μm or less. When the surface roughness Ra is 0.05 μm or more, adhesion between the substrate and the hard coating layer by an anchor effect can be expected. On the other hand, when Ra is more than 1.0 μm, an adverse influence is exerted on the surface finish of workpiece.

The surface-coated cBN-based sintered tool of the present invention is provided with a hard coating layer having an upper layer and a lower layer. By forming the upper layer in a structure consisting of at least a thin layer A and at least a thin layer B layered alternately one on another, it is possible to achieve excellent heat resistance, high-temperature hardness, high-temperature strength and shock-resistant strength. Therefore, the surface-coated cBN-based sintered tool can maintain excellent chipping resistance and wear resistance over an extended period of time without edge notching occurring at the hard coating layer, and it is possible to maintain performance of the tool (e.g., providing an excellent surface finish of workpieces) over an extended period of time, even in a cutting operation under severe conditions, for example, a high-speed continuous cutting operation or high-speed interrupted cutting operation of a hard steel such as alloy steel or hardened bearing steel, which generates high degree of heat or, in addition to the generation of high degree of heat, imposes a mechanical load intermittently and impulsively on a cutting edge.

DETAILED DESCRIPTION OF THE INVENTION

The surface-coated cBN-based sintered tool of the present invention will now be described in detail by way of examples.

EXAMPLE

Cubic boron nitride (cBN) powder, Ti nitride (TiN) powder, Al powder and aluminum oxide ($Al_2O_3$) powder, all having a mean particle size in a range from 0.5 to 4 μm, were prepared as stock material powders, were blended in proportions shown in Table 1, and were mixed using a ball mill in a wet process for 80 hours. After drying, the mixture was press-molded into a compact measuring 50 mm in diameter and 1.5 mm in thickness with a pressure of 120 MPa. The compact was sintered by heating at a predetermined temperature in a range from 900 to 1300° C. for 60 minutes in a vacuum of 1 Pa to obtain a presintered body for a cutting edge. Separately, a support member made of a WC-based cemented carbide measuring 50 mm in diameter and 2 mm in thickness, and having a composition of 8% by mass of Co and the balance of WC was prepared. The presintered body and the support member were set in a conventional ultra-high-pressure sintering apparatus in a state such that they were laid one upon another and the ultra-high-pressure sintered under the ordinary conditions of a pressure of 5 GPa, a predetermined temperature in a range from 1200 to 1400° C. and a holding time of 0.8 hours. After sintering, the top and bottom surfaces of the resulting sintered body were polished using a diamond-bonded abrasive. The sintered body was cut into an equilateral triangle-shaped tip having a side of 3 mm using a wire electric discharge machining apparatus. An insert body made of a WC-based cemented carbide having a composition of 5% by mass of Co, 5% by mass of TaC and the balance of WC, and measuring according to configuration of SNGA 120412 specified in ISO standard (square measuring 4.76 mm in thickness and 12.7 mm in side) was prepared. The above-described cut tip of the ultra-high-pressure sintered body was brazed to the soldering portion (corner portion) of the above-described insert body using a brazing material of Ag alloy having a composition (by mass %) of 26% Cu, 5% Ti, 2.5% Ni and the balance of Ag. After a peripheral milling to form a body having a predetermined size, the cutting edge portion was subjected to a honing process (width: 0.13 mm, angle: 25), and then subjected to finish polishing. In accordance with the above-described process, tool bodies A through J having a geometrical configuration of an insert meeting SNGA 120412 specified in ISO standard were produced.

Figure 1A:
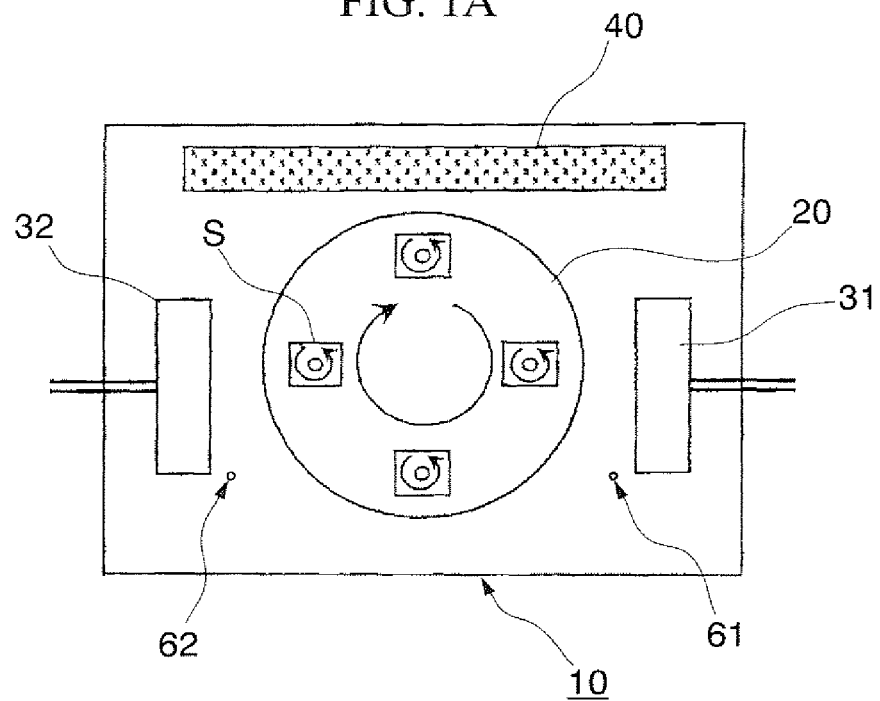
FIG. 1A is a schematic plan view of an arc ion plating apparatus used to form the hard coating layer as a constituent of the surface-coated cBN-based sintered tool of the present invention.
Figure 1B:
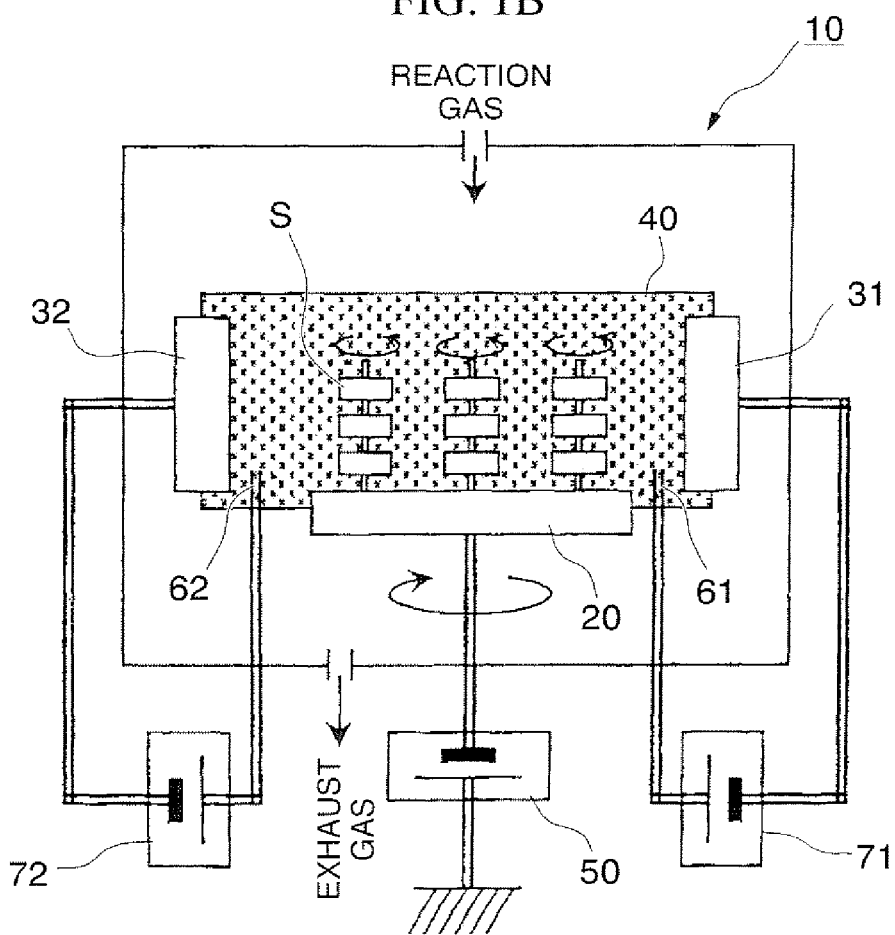
FIG. 1B is a schematic front view of the arc ion plating apparatus used to form the hard coating layer as a constituent of the surface-coated cBN-based sintered tool of the present invention.

(a) Then the tool bodies A through J were subjected to ultrasonic cleaning in acetone. After drying, the tool bodies were set on a rotary table 20 along the circumference thereof at a predetermined radial distance from the center, in an arc ion plating apparatus 10 as shown in FIGS. 1A and 1B. A metallic Ti for forming the thin layer B as the upper layer was placed as a cathode (evaporation source) 31 on one side, and as a cathode (evaporation source) 32 for forming the thin layer A as the upper layer and the lower layer, a Ti—Al—Si alloy having a composition corresponding to the target composition shown in Table 2 was placed on the other side so as to oppose the cathode 32, with the rotary table 2 located therebetween. The reference symbol 50 denotes a bias power source and the reference symbols 71, 72 denote arc power sources.

(b) While evacuating the apparatus to maintain the inside at a vacuum level not higher than 0.1 Pa, the inside of the apparatus was heated to 500° C. using a heater 40 and an Ar gas was introduced into the apparatus to maintain a reaction atmosphere of 0.7 Pa and also a DC bias voltage of −200 V was applied to the tool body S that was spinning (revolving) on the rotating table 20 (table which was rotating), thereby cleaning the surface of the tool body S by bombardment of argon ions.

(c) Then nitrogen gas was introduced as a reaction gas into the apparatus to maintain a reaction atmosphere of 3 Pa, and a DC bias voltage of −100 V was applied to the tool body S that was spinning on the rotating table 20. At the same time, arc discharge was generated by supplying a current of 100 A between the Ti—Al—Si alloy used for forming the thin layer A and the lower layer, and the anode 62, thereby vapor depositing a [Ti, Al, Si]N layer having the target composition and the target layer thickness shown in Table 2 as the lower layer of the hard coating layer on the surface of the tool body S.

(d) Then, a flow rate of nitrogen gas as a reaction gas to be introduced into the apparatus was controlled to maintain a reaction atmosphere of 2 Pa, and a DC bias voltage in a range from −10 to −100 V was applied to the tool body S that was spinning on the rotating table 20. At the same time, arc discharge was generated by supplying a current of predetermined intensity in a range from 50 to 200 A between the cathode 31 of the metallic Ti used for forming the thin layer B, and the anode 61, thereby forming the thin layer B of a predetermined thickness on the surface of the tool body. After forming the thin layer B, the arc discharge was stopped and a current of predetermined intensity in a range from 50 to 200 A was supplied between the cathode 32 of Ti—Al—Si alloy used for forming the thin layer A and the lower layer and the anode 62, thereby generating arc discharge and forming the thin layer A of the predetermined thickness. Then the arc discharge was stopped. Then, the formation of the thin layer B by arc discharge between the cathode 31 of the metallic Ti used for forming the thin layer B and the anode 61, and the formation of the thin layer A by arc discharge between the cathode 32 of a Ti—Al—Si alloy used for forming the thin layer A and the lower layer and the anode 62 were repeated alternately. Thus the upper layer having a structure consisting of the thin layer A and the thin layer B layered alternately having the target composition and the target thickness for a single layer shown in Table 2 was formed on the surface of the tool body with a total thickness (average layer thickness) shown in Table 2 by vapor deposition. Thus, each of the surface-coated cBN-based sintered tools 1 to 10 according to the invention was produced.

Figure 2:
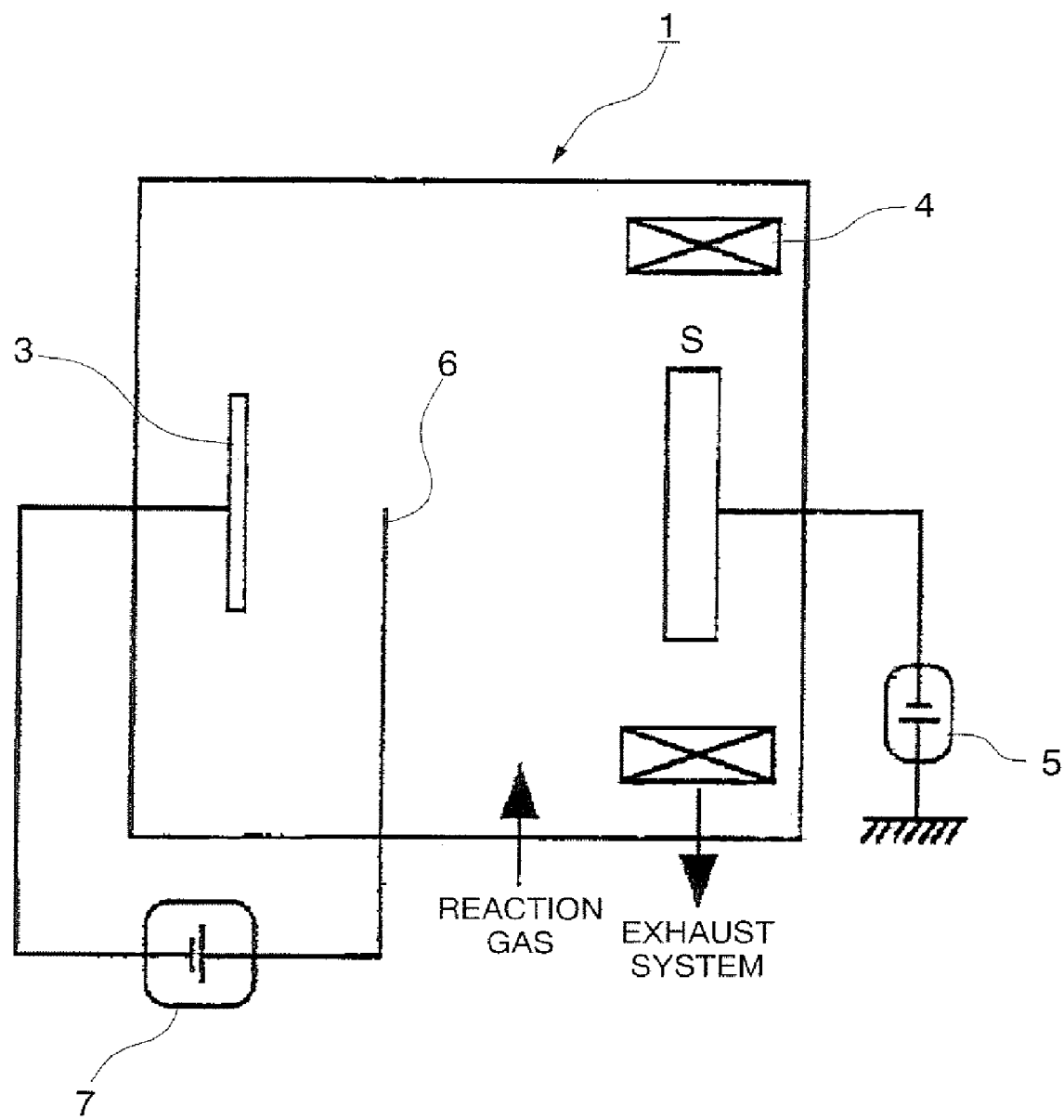
FIG. 2 is a schematic diagram showing a conventional arc ion plating apparatus.

For the purpose of comparison, the tool bodies A through J were subjected to ultrasonic cleaning in acetone. After drying, the tool bodies were set in a standard arc ion plating apparatus 1 as shown in FIG. 2, and the Ti—Al—Si alloy having the composition corresponding to the target composition shown in Tables 3 was disposed as a cathode (evaporation source) 3. While evacuating the apparatus to maintain the inside at a vacuum level not higher than 0.1 Pa, the inside of the apparatus was heated to 500° C. using a heater 4 and Ar gas was introduced into the apparatus to maintain a reaction atmosphere of 0.7 Pa and also a DC bias voltage of −200 V was applied to the tool body S that was spinning on the rotating table 2, thereby cleaning the surface of the tool body by bombardment of argon ions. Then nitrogen gas was introduced as a reaction gas into the apparatus to maintain a reaction atmosphere of 3 Pa, and the bias voltage applied to the tool body was set to −100 V, and arc discharge was generated between the cathode 3 made of the Ti—Al—Si alloy and the anode 6 using an arc power source 7. Thus the surfaces of the tool bodies A through J were coated with the [Ti, Al, Si]N layer having the target composition and target layer thickness shown in Table 3, thereby producing conventional surface-coated cBN-based sintered tools 1 to 10.

With respect to the cBN-based sintered material constituting the cutting insert body of various surface-coated cBN-based sintered tools thus obtained, the structure was observed using a scanning electron microscope. As a result, all cutting insert bodies exhibited a structure in which an ultra-high-pressure sintering reaction product is present at the interface between a cBN phase constituting substantially a dispersed phase and a TiN phase constituting a continuous phase.

Furthermore, the compositions of the surface coating layer were analyzed by energy-dispersive X-ray analysis using a transmission electron microscope, and all samples showed substantially the same compositions as the target compositions. Also, the average layer thickness of the constituent layers of the hard coating layer was measured by observing the cross-section with a transmission electron microscope. All samples showed substantially the same average layer thickness (mean of measurements at 5 points) as the target thickness.

Then, various surface-coated cBN-based sintered tools were mounted at the distal end of a cutting tool made of tool steel by screwing a clamp fixture. The surface-coated cBN-based sintered tools Nos. 1 through 5 according to the invention and the conventional surface-coated cBN-based sintered tools Nos. 1 through 5 were subjected to a high-speed interrupted cutting operation test under the following cutting conditions A through C. Also the surface-coated cBN-based sintered tools Nos. 6 through 10 according to the invention and the conventional surface-coated cBN-based sintered tools Nos. 6 through 10 were subjected to a high-speed continuous cutting operation test under the following cutting conditions a through c.

[Cutting Conditions A]

Interrupted high-speed cutting operation test (normal cutting speed was 120 m/min.) in a dry process of an alloy steel was performed under the following conditions:

Workpiece: Round bar of carburized and hardened (quenched) JIS SCM415 (hardness: HRC61) with 4 grooves formed in a longitudinal direction at equal spaces Cutting speed: 250 m/min
Depth of cut: 0.15 mm
Feed: 0.08 mm/rev
Cutting time: 8 minutes.

[Cutting Conditions B]

Interrupted high-speed cutting operation test (normal cutting speed was 120 m/min.) in a dry process of a chrome steel was performed under the following conditions:

Workpiece: Round bar of carburized and hardened JIS SCr420 (hardness: HRC60) with 4 grooves formed in a longitudinal direction at equal spaces Cutting speed: 260 m/min
Depth of cut: 0.15 mm
Feed: 0.09 mm/rev.
Cutting time: 8 minutes

[Cutting Conditions C]

Interrupted high-speed cutting operation test (normal cutting speed was 150 m/min.) in a dry process of a bearing steel was performed under the following conditions:

Workpiece: Round bar of hardened JIS SUJ2 (hardness: HRC61) with 4 grooves formed in a longitudinal direction at equal spaces.

Cutting speed: 250 m/min.
Depth of cut: 0.12 mm
Feed: 0.07 mm/rev.
Cutting time: 8 minutes

[Cutting Conditions a]

Continuous high-speed cutting operation test (normal cutting speed was 180 m/min.) in a dry process of an alloy steel was performed under the following conditions:
Workpiece: Round bar of carburized and hardened JIS SCM415 (hardness: HRC61)
Cutting speed: 260 m/min.
Depth of cut: 0.25 mm
Feed: 0.12 mm/rev.
Cutting time: 8 minutes

[Cutting Conditions b]

Continuous high-speed cutting operation test (normal cutting speed was 180 m/min.) in a dry process of a chrome steel was performed under the following conditions:

Workpiece. Round bar of carburized and hardened JIS SCr420 (hardness: HRC60)
Cutting speed: 270 m/min.
Depth of cut: 0.15 mm
Feed: 0.08 mm/rev.
Cutting time: 8 minutes

[Cutting Conditions c]

Continuous high-speed cutting operation test (normal cutting speed was 150 m/min.) in a dry process of a bearing steel was performed under the following conditions:
Workpiece: Round bar of hardened JIS SUJ2 (hardness HRC61)
Cutting speed: 240 m/min.
Depth of cut: 0.15 mm
Feed: 0.07 mm/rev.
Cutting time: 8 minutes Flank wear width (mm) of the cutting tool edge and surface finish (arithmetic mean height (Ra (μm)) according to JIS B0601-2001) of the workpiece were measured in every run of the cutting tests described above. The results are shown in Tables 4 and 5

TABLE 1

| Type | | TiN | Al | $Al_2O_3$ | cBN |
|---|---|---|---|---|---|
| TOOL BODY | A | 13 | 16 | 2.0 | Balance |
| | B | 15 | 17 | — | Balance |
| | C | 17 | 15 | — | Balance |
| | D | 19 | 13 | 1.0 | Balance |
| | E | 21 | 12 | 0.5 | Balance |
| | F | 22 | 10 | 1.2 | Balance |
| | G | 24 | 11 | 1.0 | Balance |
| | H | 26 | 12 | — | Balance |
| | I | 28 | 6 | 0.5 | Balance |
| | J | 30 | 8 | 0.2 | Balance |

Composition (% by mass)

TABLE 2

Hard coating layer

| | | | Lower layer | | | | | Upper layer | | | | | |
|---|---|---|---|---|---|---|---|---|---|---|---|---|---|
| | | | | | | | | Thin layer A | | | | Thin layer B | |
| Type | Symbol of tool body | Target composition (atomic ratio) Ti | Al | Si | N | Target thickness (μm) | Target composition (atomic ratio) Ti | Al | Si | N | Target thickness of one layer (μm) | Target thickness of one layer (μm) | Total thickness of upper layer (μm) |
| Surface-coated cBN-based sintered tool according to the invention | 1 A | 0.50 | 0.40 | 0.10 | 1.0 | 2.5 | 0.50 | 0.40 | 0.10 | 1.0 | 0.05 | 0.1 | 3.0 |
| | 2 B | 0.50 | 0.45 | 0.05 | 1.0 | 1.5 | 0.50 | 0.45 | 0.05 | 1.0 | 0.1 | 0.05 | 0.3 |
| | 3 C | 0.48 | 0.50 | 0.02 | 1.0 | 2.0 | 0.48 | 0.50 | 0.02 | 1.0 | 0.2 | 0.15 | 1.05 |
| | 4 D | 0.39 | 0.55 | 0.06 | 1.0 | 1.8 | 0.39 | 0.55 | 0.06 | 1.0 | 0.3 | 0.1 | 0.8 |
| | 5 E | 0.37 | 0.60 | 0.03 | 1.0 | 3.0 | 0.37 | 0.60 | 0.03 | 1.0 | 0.15 | 0.3 | 1.8 |
| | 6 F | 0.50 | 0.40 | 0.10 | 1.0 | 2.5 | 0.50 | 0.40 | 0.10 | 1.0 | 0.05 | 0.1 | 3.0 |
| | 7 G | 0.50 | 0.45 | 0.05 | 1.0 | 1.5 | 0.50 | 0.45 | 0.05 | 1.0 | 0.1 | 0.05 | 0.3 |
| | 8 H | 0.48 | 0.50 | 0.02 | 1.0 | 2.0 | 0.48 | 0.50 | 0.02 | 1.0 | 0.2 | 0.15 | 1.05 |
| | 9 I | 0.39 | 0.55 | 0.06 | 1.0 | 1.8 | 0.39 | 0.55 | 0.06 | 1.0 | 0.3 | 0.1 | 0.8 |
| | 10 J | 0.37 | 0.60 | 0.03 | 1.0 | 3.0 | 0.37 | 0.60 | 0.03 | 1.0 | 0.15 | 0.3 | 1.8 |

TABLE 3

Hard coating layer

| Type | Symbol of tool body | Target composition (atomic ratio) Ti | Al | Si | N | Target thickness (μm) |
|---|---|---|---|---|---|---|
| Conventional surface-coated cBN-based sintered tool | 1 A | 0.50 | 0.40 | 0.10 | 1.0 | 3.0 |
| | 2 B | 0.50 | 0.45 | 0.05 | 1.0 | 1.8 |
| | 3 C | 0.48 | 0.50 | 0.02 | 1.0 | 3.5 |
| | 4 D | 0.39 | 0.55 | 0.06 | 1.0 | 2.5 |
| | 5 E | 0.37 | 0.60 | 0.03 | 1.0 | 6.0 |
| | 6 F | 0.50 | 0.40 | 0.10 | 1.0 | 3.0 |
| | 7 G | 0.50 | 0.45 | 0.05 | 1.0 | 1.8 |
| | 8 H | 0.48 | 0.50 | 0.02 | 1.0 | 3.5 |
| | 9 I | 0.39 | 0.55 | 0.06 | 1.0 | 2.5 |
| | 10 J | 0.37 | 0.60 | 0.03 | 1.0 | 6.0 |

TABLE 4

| Type | | Width of flank wear (mm) | Surface finish [Ra (μm)] | Width of flank wear (mm) | Surface finish [Ra (μm)] | Width of flank wear (mm) | Surface finish [Ra (μm)] |
|---|---|---|---|---|---|---|---|
| | | Cutting conditions (A) | | Cutting conditions (B) | | Cutting conditions (C) | |
| Surface-coated cBN-based sintered tool according to the invention | 1 | 0.12 | 0.3 | 0.12 | 0.4 | 0.11 | 0.3 |
| | 2 | 0.10 | 0.4 | 0.13 | 0.6 | 0.12 | 0.5 |
| | 3 | 0.09 | 0.4 | 0.10 | 0.3 | 0.13 | 0.2 |
| | 4 | 0.11 | 0.3 | 0.12 | 0.5 | 0.11 | 0.6 |
| | 5 | 0.08 | 0.5 | 0.11 | 0.7 | 0.09 | 0.7 |
| | | Cutting conditions (a) | | Cutting conditions (b) | | Cutting conditions (c) | |
| | 6 | 0.13 | 0.5 | 0.13 | 0.2 | 0.12 | 0.3 |
| | 7 | 0.12 | 0.4 | 0.13 | 0.2 | 0.13 | 0.2 |
| | 8 | 0.11 | 0.6 | 0.12 | 0.3 | 0.11 | 0.3 |
| | 9 | 0.10 | 0.4 | 0.10 | 0.3 | 0.10 | 0.3 |
| | 10 | 0.08 | 0.4 | 0.09 | 0.3 | 0.08 | 0.3 |

TABLE 5

| Type | | Width of flank wear (mm) | Surface finish [Ra (μm)] | Width of flank wear (mm) | Surface finish [Ra (μm)] | Width of flank wear (mm) | Surface finish [Ra (μm)] |
|---|---|---|---|---|---|---|---|
| | | Cutting conditions (A) | | Cutting conditions (B) | | Cutting conditions (C) | |
| Conventional surface-coated cBN-based sintered tool | 1 | 2 min.** | — | 3 min.** | — | 4 min.** | — |
| | 2 | 1 min.** | — | 6 min.** | — | 3 min.** | — |
| | 3 | 2 min.** | — | 5 min.** | — | 3 min.** | — |
| | 4 | 4 min.** | — | 4 min.** | — | 4 min.** | — |
| | 5 | 0.11 min.** | 1.8 | 4 min.** | — | 5 min.** | — |
| | | Cutting conditions (a) | | Cutting conditions (b) | | Cutting conditions (c) | |
| | 6 | 0.12* | 1.5 | 0.13* | 1.2 | 0.12* | 1.6 |
| | 7 | 6 min.** | — | 0.11* | 1.5 | 0.13* | 2.0 |
| | 8 | 5 min.** | — | 5 min.** | — | 0.11* | 1.3 |
| | 9 | 4 min.** | — | 4 min.** | — | 6 min.** | — |
| | 10 | 3 min.** | — | 4 min.** | — | 5 min.** | — |

In the table, the symbol* means tools in which edge notching occurred, while the symbol** means the cutting time (min.) of tools in which tool life ended due to edge notching and chipping.

The results shown in Tables 2 through 5 obviously show the following effects of the invention. All the surface-coated cBN-based sintered tools according to the present invention had a hard coating layer having: a lower layer having an average layer thickness in a range from 1.5 to 3 μm; and an upper layer of the average layer thickness (total thickness) in a range from 0.3 to 3 μm, consisting of the thin layer A and the thin layer B, each having an average layer thickness in a range from 0.05 to 0.3 μm layered alternately one on another. In each of the surface-coated cBN-based sintered tools of the invention, since the lower layer is provided with excellent heat resistance, high-temperature strength and high-temperature hardness, and the upper layer is provided with excellent heat resistance and high-temperature hardness as well as further excellent high-temperature strength and shock-resistant strength, the hard coating layer combined these excellent characteristics, and therefore can exhibit excellent wear resistance and ensure an excellent surface finish of workpieces without causing edge notching and chipping even in a high-speed cutting operation of a hard steel, for example, hard steel such as alloy steel or hardened bearing steel. In contrast, the conventional surface-coated cBN-based sintered tools having the hard coating layer comprising [Ti, Al, Si]N single layer, caused edge notching or chipping at the cutting edge because of insufficient high-temperature strength and shock-resistant strength of the hard coating layer. Tool life of the conventional surface-coated cBN-based sintered tools ended in a relatively short period of time, and workpieces showed a remarkably inferior surface.

As described above, as well as in machining of various types of steel and cast iron under ordinary cutting conditions, even in a high-speed continuous cutting operation or a high-speed interrupted cutting operation of a hard steel accompanied with generation of high degree of heat and imposition of a drastically large mechanical load intermittently and impulsively on a cutting edge, the surface-coated cBN-based sintered tool of the present invention is excellent in edge notching resistance exhibited by the hard coating layer, provides an excellent surface finish of a workpiece over an extended period of operation time and exhibits an excellent wear resistance. Thus, the surface-coated cBN-based sintered tool of the present invention contributes to the enhancement of performance of a cutting apparatus and can sufficiently allow for labor saving, energy saving and cost reduction in cutting operations.

While preferred embodiments of the invention have been described and illustrated above, it should be understood that these are exemplary of the invention and are not to be considered limiting. Additions, omissions substitutions and other modifications can be made without departing from the spirit or scope of the present invention. Accordingly, the invention is not considered as being limited by the foregoing description, and is only limited by the scope of the appended claims.

What is claimed is:

1. A cutting tool made of a surface-coated cubic boron nitride-based ultra-high-pressure sintered material, comprising:
   a main body consisting of the ultra-high-pressure sintered material formed by ultra-high-pressure sintering of a compact having a composition of, in mass %, 13 to 30% of titanium nitride, 6.5 to 18% of aluminum and/or aluminum oxide and a balance of boron nitride, wherein under observation using a scanning electron microscope, the main body shows a texture such that an ultra-high-pressure sintering reaction product is present at the interface between a cubic boron nitride phase constituting a dispersed phase and a titanium nitride phase constituting a continuous phase; and a hard coating layer that has been vapor-deposited on the surface of the main body and has a lower layer of an average layer thickness in a range from 1.5 to 3 μm and an upper layer of an average layer thickness in a range from 0.3 to 3 μm, wherein:

the lower layer of the hard coating layer consists of a vapor-deposited nitride of Ti, Al and Si having a composition of $[Ti_{1-X-Y}Al_XSi_Y]N$, where X is in a range from 0.40 to 0.60 and Y is in a range from 0.02 to 0.10 in an atomic ratio; and the upper layer of the hard coating layer has been vapor-deposited on the surface of the lower layer, and consists of thin layers A consisting of a nitride of Ti, Al and Si having the composition of $[Ti_{1-X-Y}Al_XSi_Y]N$, where X is in a range from 0.40 to 0.60 and Y is in a range from 0.02 to 0.10 in an atomic ratio, and thin layers B consisting of a Ti nitride (TiN), and has a structure in which the thin layer A and the thin layer B are layered alternately such that an average layer thickness of each single layer is in a range of 0.05 to 0.2 μm, and an average layer thickness of each single layer of the thin layer B is in a range of 0.05 to 0.15 μm.

2. A cutting tool made of a surface-coated cubic boron nitride-based ultra-high-pressure sintered material according to claim 1, wherein the thin layer B is firstly formed on the surface of the lower layer.

3. A cutting tool made of a surface-coated cubic boron nitride-based ultra-high-pressure sintered material according to claim 1, wherein the average layer thickness of each single layer of the thin layers A and the average layer thickness of each single layer of the thin layers B are controlled to be not larger than a half of the average layer thickness of the upper layer.

4. A cutting tool made of a surface-coated cubic boron nitride-based ultra-high-pressure sintered material according to claim 1, wherein a surface roughness of the main body is 0.05 μm or more and 1.0 μm or less.

5. A surface-coated cutting tool according to claim 1, wherein the upper layer of the hard coating layer consists of two to three thin layers A and two to three thin layers B stacked alternately.

6. A surface-coated cutting tool according to claim 1, wherein the hard coating further comprises a Ti-Al-Si composite nitride layer of 0.2 to 2μm in thickness formed on the surface of the upper layer.

* * * * *